United States Patent
Cooke et al.

(10) Patent No.: US 7,100,124 B2
(45) Date of Patent: Aug. 29, 2006

(54) INTERFACE CONFIGURABLE FOR USE WITH TARGET/INITIATOR SIGNALS

(75) Inventors: Laurence H. Cooke, Los Gatos, CA (US); Alexander Lu, Milpitas, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 786 days.

(21) Appl. No.: 09/765,917

(22) Filed: Jan. 18, 2001

(65) Prior Publication Data

US 2002/0016706 A1    Feb. 7, 2002

Related U.S. Application Data

(60) Provisional application No. 60/216,746, filed on Jul. 3, 2000.

(51) Int. Cl.
*G06F 17/50* (2006.01)
*G06F 9/45* (2006.01)

(52) U.S. Cl. .................. 716/1; 716/8; 716/9
(58) Field of Classification Search ........... 716/1–6, 716/8, 9
See application file for complete search history.

(56) References Cited

U.S. PATENT DOCUMENTS

| | | | |
|---|---|---|---|
| 4,872,169 A | 10/1989 | Whetsel, Jr. | |
| 5,517,432 A * | 5/1996 | Chandra et al. | ............... 703/14 |
| 5,539,652 A | 7/1996 | Tegethoff | |
| 5,557,779 A | 9/1996 | Minami | |
| 5,577,213 A | 11/1996 | Avery et al. | |
| 5,581,669 A | 12/1996 | Voth | |
| 5,596,587 A | 1/1997 | Douglas et al. | |
| 5,644,754 A | 7/1997 | Weber et al. | |
| 5,732,209 A | 3/1998 | Vigil et al. | |
| 5,737,234 A | 4/1998 | Seidel et al. | |
| 5,761,078 A | 6/1998 | Fuller et al. | |
| 5,774,371 A | 6/1998 | Kawakami | |
| 5,784,291 A * | 7/1998 | Chen et al. | ............... 716/10 |
| 5,838,583 A | 11/1998 | Varadarajan et al. | ........ 364/491 |
| 5,960,186 A | 9/1999 | Jones et al. | |
| 5,983,303 A | 11/1999 | Sheafor et al. | ............. 710/126 |
| 6,034,542 A | 3/2000 | Ridgeway | .................... 326/39 |
| 6,102,961 A | 8/2000 | Lee et al. | |

(Continued)

FOREIGN PATENT DOCUMENTS

GB    2 326 065 A    12/1998

OTHER PUBLICATIONS

"Virtual Socket Interface Alliance (VSIA)"; *VCI Standard OCB, Version 1*; Dec. 9, 1999; pp. 57.

(Continued)

*Primary Examiner*—Thuan Do
*Assistant Examiner*—Magid Y. Dimyan
(74) *Attorney, Agent, or Firm*—Bingham McCutchen LLP

(57) ABSTRACT

Systems and methods for designing integrated circuits and for creating and using androgynous interfaces between electronic components of integrated circuits are disclosed. One preferred method of designing an integrated circuit includes several steps. In one step, a foundation block for the integrated circuit is specified, including specifying the locations of multiple androgynous interfaces in the integrated circuit. In another step, one or more component blocks to comprise the integrated circuit are identified for use. In another step, the component blocks to form a layout of the integrated circuit are positioned in a manner that minimizes connection distances between functional blocks and between functional blocks and the androgynous interfaces. In another step, the androgynous interfaces are set to perform as targets (slaves) or initiators (masters) based on the layout.

20 Claims, 9 Drawing Sheets

U.S. PATENT DOCUMENTS

| | | | |
|---|---|---|---|
| 6,122,690 A * | 9/2000 | Nannetti et al. ............. | 710/311 |
| 6,134,606 A | 10/2000 | Anderson et al. | |
| 6,148,432 A | 11/2000 | Brown | |
| 6,154,873 A | 11/2000 | Takahashi | |
| 6,237,128 B1 | 5/2001 | Folberth et al. | |
| 6,260,175 B1 | 7/2001 | Basel | |
| 6,269,467 B1 | 7/2001 | Chang et al. | |
| 6,286,128 B1 | 9/2001 | Pileggi et al. | |
| 6,292,929 B1 | 9/2001 | Scepanovic et al. | |
| 6,305,001 B1 | 10/2001 | Graef | |
| 6,311,302 B1 | 10/2001 | Cassetti et al. | |
| 6,311,313 B1 | 10/2001 | Camporese et al. | |
| 6,327,696 B1 | 12/2001 | Mahajan | |
| 6,347,395 B1 | 2/2002 | Payne et al. | |
| 6,367,051 B1 | 4/2002 | Pileggi et al. | |
| 6,367,060 B1 | 4/2002 | Cheng et al. | |
| 6,477,691 B1 * | 11/2002 | Bergamashi et al. .......... | 716/12 |
| 6,701,474 B1 * | 3/2004 | Cooke et al. ................ | 714/724 |
| 6,751,723 B1 * | 6/2004 | Kundu et al. .................. | 712/36 |
| 6,845,489 B1 * | 1/2005 | Mizuno et al. ................ | 716/1 |

OTHER PUBLICATIONS

Su, Hsiao-Pin et al., "A Timing-Driven Soft-Macro Placement and Resynthesis Method in Interaction with Chip Floorplanning", IEEE Transaction on Computer-Aided Design of Integrated Circuits and Systems, Apr. 1999, vol. 18, No. 4, pp. 475-483.

Chao, Ting-Hai et al., "A Clock Net Routing Algorithm for High Performance VLSI", IEEE 1992, pp. 343-347.

Jackson, Michael, A.B. et al., "Clock Routing for High-Performance ICs", 27th ACM/IEEE Design Automation Conference 1990, pp. 573-579.

Khan, Wasim et al., "An Hierarchical Approach to Clock Routing in High Performance Systems", IEEE, 1994, pp. 467-470.

Sato, Hidenori et al., "A Balanced-Mesh Clock Routing Technique Using Circuit Partitioning", IEEE 1996, pp. 237-243.

International Search Report, PCT/US01/01738, May 1, 2001.

International Search Report, PCT/US01/20641, Jun. 28, 2001.

International Search Report, PCT/US01/01820, Apr. 18, 2001.

* cited by examiner

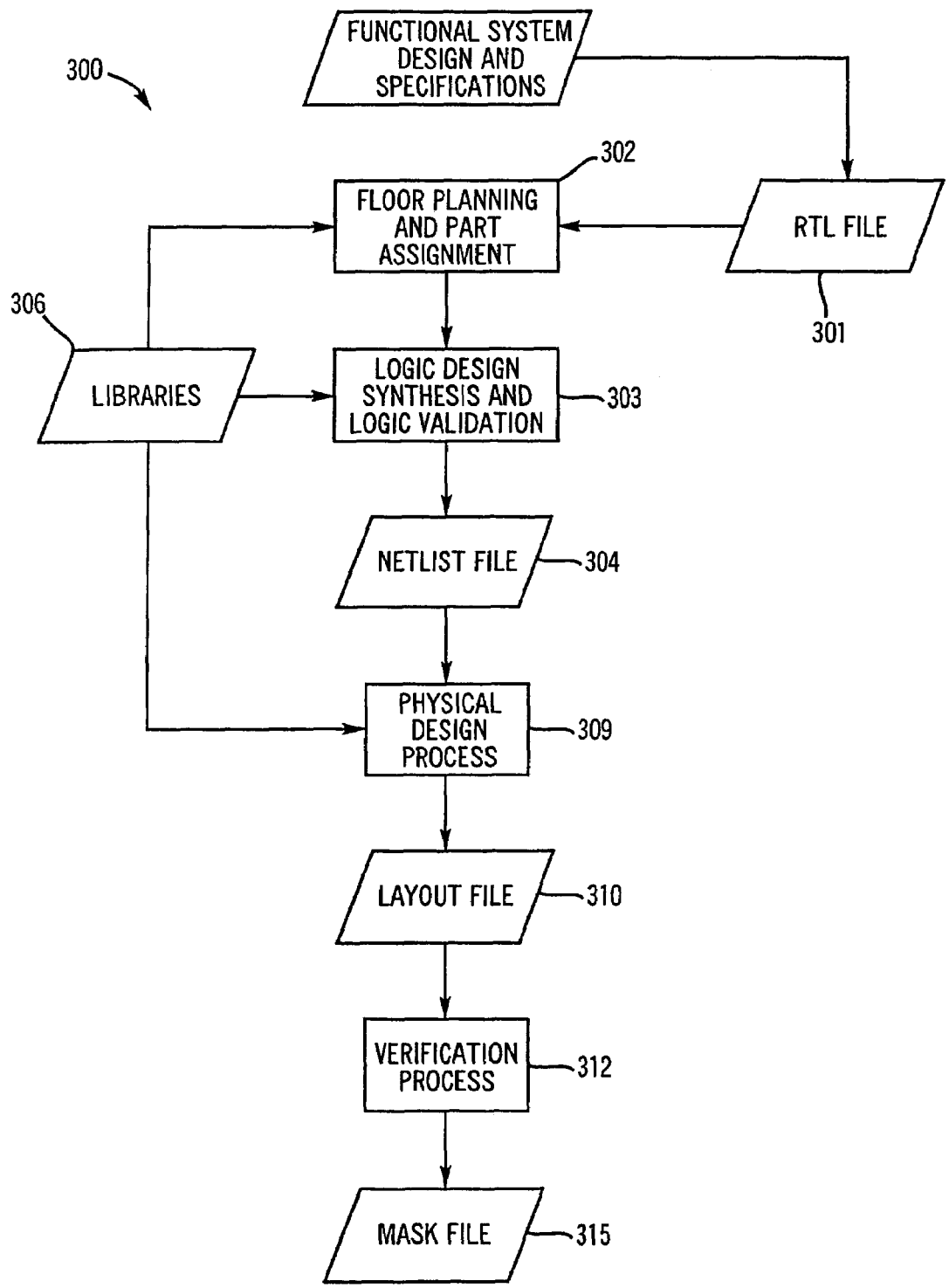

| I/T | | T/I |
|---|---|---|
| R_data | <- | Data |
| R_addr | <- | Addr |
| R_cmd | <- | Cmd |
| R_Plen | <- | Plen |
| R_Cfix | <- | Cfix |
| R_Clen | <- | Clen |
| R_dval | <- | Dval |
| ACK | -> | R_Ack |
| R_eop | <- | Eop |
| R_error | <- | Error |
| Data | -> | R_Data |
| Addr | -> | R_Addr |
| Cmd | -> | R_Cmd |
| Plen | -> | R_Plen |
| Cfix | -> | R_Cfix |
| Clen | -> | R_Clen |
| Dval | -> | R_Dval |
| R_Ack | <- | Ack |
| Eop | -> | R_Eop |
| Error | -> | R_Error |

FIG. 5.

| SOC MASTER | | VCI SLAVE | VCI MASTER | | SOC SLAVE |
|---|---|---|---|---|---|
| BCLK | == | CLOCK | CLOCK | == | BCLK |
| BnRES | == | RESETN | RESETN | == | BnRES |
| r_gnt | <- | CMDACK | CMDACK | <- | gnt |
| r_req | -> | CMDVAL | CMDVAL | -> | req |
| r_addr | -> | ADDR[n-1:0] | ADDR[n-1:0] | -> | addr |
| 1111 | -> | BE[b-1:0\|0:b-1] | BE[b-1:0\|0:b-1] | -> | xxxx |
| 0 | -> | CFIXED | CFIXED | -> | x |
| 0 | -> | CLEN[q-1:0] | CLEN[q-1:0] | -> | x |
| r_cmd | -> | CMD[1:0] | CMD[1:0] | -> | cmd |
| 1 | -> | CONTIG | CONTIG | -> | x |
| r_data | -> | WDATA[8b-1:0] | WDATA[8b-1:0] | -> | data |
| r_eop | -> | EOP | EOP | -> | eop |
| 0 | -> | CONST | CONST | -> | x |
| r_d_size | -> | PLEN[k-1:0] | PLEN[k-1:0] | -> | d_size |
| 0 | -> | WRAP | WRAP | -> | x |
| gnt | -> | RSPACK | RSPACK | -> | r_gnt |
| req | <- | RSPVAL | RSPVAL | <- | r_req |
| data | <- | RDATA[8b-1:0] | RDATA[8b-1:0] | <- | r_data |
| eop | <- | REOP | REOP | <- | r_eop |
| error | <- | RERROR | RERROR | <- | r_error |

FIG. 7

INTERFACE CONFIGURABLE FOR USE WITH TARGET/INITIATOR SIGNALS

This application claims priority to a U.S. Provisional Application entitled "System-on-a-Chip-1," having Ser. No. 60/216,746 and filed on Jul. 3, 2000, and which is hereby incorporated by reference into this application as though fully set forth herein.

BACKGROUND OF THE INVENTION

1. Field of the Invention

The field of the present invention relates to electronic hardware, including virtual, component design. In particular, the field of the present invention relates to the interfaces between components.

2. Background

The methodologies for designing, testing and manufacturing integrated circuits (ICs) continue to evolve. Today, with the continually increasing complexity and density of ICs, designing for reusability is becoming an overriding priority. One consequence of this priority is the increasing distinction of between the developers of potentially reusable functional component blocks, that when used with each other provide the foundation for an IC or the design of an IC, and the integrators of such blocks. A number of companies focus on the development of such functional block components. Some of the same companies as well as many others perform the integration and/or manufacturing of the ultimate ICs.

One of the new developments in circuit designs is the advent of so-called virtual component blocks, which, from a general standpoint, are pre-designed and pre-hardened (or semi-hardened) circuit designs in software form (for example, in GDSII format), which can be readily re-used or recycled in different, larger circuit designs. An advantage of virtual component (or VC) blocks is that they reduce the time to design an overall circuit, and thereby, increase the speed to market.

The breakdown of IC development into the design of discrete functional components, and the fact that there are many providers of such components, has in part been responsible for the creation of a need to have a standard interface for communicating between components. This is one of the goals of the Virtual Socket Interface Alliance (VSIA) Virtual Component Interface (VCI) Standard. A draft of this standard, Standard 2 Version 1.0 (Working Revision (Feb. 2, 2000) is attached as an appendix. To meet this stated goal, which includes objectives of connectability, flexibility, and portability of component blocks, the VCI protocol, as outlined in the specification, has been developed with an eye towards simplicity.

A preference for simplicity in the VCI protocol, in turn, has necessarily led to certain requirements to which component blocks that adopt the protocol must adhere. A first requirement is that one side of the interface is required to act as a master or initiator of a communication and the other side is required to act as a slave or target for the communication. As such, the design of the target interface has inherent differences from that of the initiator interface. Specifically, each side of the interface, by definition, comprises different logic to enable each side to perform its predefined role in the communication. Because of these complementary functions, the inputs and outputs on each side of the interface are also different from each other. The pins on each side of the interface to which connections are made represent a type of signal input or output that is generally specific to that side of the interface.

Another requirement is that the VC Interface of a functional block be a unidirectional interface. Output pins on one side of the interface are connected to input pins on the other side of the interface, such that signals travel in only one direction for a given connection.

Thus, functional components (including virtual components (VCs)) that include a VC interface can act only as targets or initiators in a point-to-point communication. As such, in any communication between two components, if one component is defined as a master, the other must be a slave, and vice versa.

In any methodology for designing ICs based on predefined component blocks, one of the first steps is to specify, as a starting point, the component blocks that will be used as the foundation of the design. One such component block that is identified at this stage is the foundation block, a block that typically comprises a processor, some memory and a communication block. The communication block has the primary purpose of transferring data from one place to another, and in the context of IC design includes a bus connected to multiple I/O ports. The foundation block often manages the communication between most if not all of the other component blocks to be used in the IC. Because it includes a communication block, the foundation block typically includes on its edges a large number of ports, of which some are initiators and others are targets. Because of the requirements of standard protocols such as the VCI protocol, the type of interface at a particular location on the edge of a foundation block must be predefined. Thus, characterizing the foundation block that is to be used for a given IC typically requires specifying a bus and the number, locations and types of ports on the edges of the block. For example, one common layout of ports for a foundation block is to position them evenly around the foundation block to provide for floor-planning flexibility.

One of the next steps is specifying the placement of the component blocks, including the foundation block, to form the layout of the IC. In this process, chip designers try to minimize wire lengths between pins of different components and minimize the overall area or footprint of the IC. Increasingly, these connection distances are the greatest speed-limiting factor in efforts to increase the speed and performance of an IC.

To assist in optimizing the layout of the IC, chip designers often use electronic design automation (EDA) software tools. The component blocks are automatically "placed" (i.e., given specific coordinate locations in the circuit layout) and "routed" (i.e., wired or connected together according to the designer's circuit definitions). The placement and routing software routines generally accept as their input a flattened netlist that has been generated by a prior logic synthesis process. This flattened netlist identifies the specific components from a component library, and describes the specific component-to-component connectivity. After this specific connectivity has been established, the physical design and layout software creates a physical layout file of the integrated circuit, including the physical position of each metal line (i.e., wire) and each via (i.e., metal transition between chip layers).

Further explanation of a particular chip design process is set forth, for example, in U.S. Pat. No. 5,838,583, hereby incorporated by reference as if set forth fully herein.

Because the ports for the foundation block are specified before the layout process can be performed, the flexibility in component block placement is potentially limited by the locations and types of ports that have been specified. Essentially, the capability of optimizing a design footprint or achieving minimum connection lengths, and thereby, the IC's overall speed and performance, is compromised.

A need exists therefore, for a way of optimizing for speed and performance in an electronic design without incurring the limitations inherent in a predefined foundation block or other functional block.

SUMMARY OF THE INVENTION

The present invention, in one aspect, provides a systems and methods for designing an integrated circuit and for creating and using an androgynous interface between electronic components of an integrated circuit.

In one embodiment, an androgynous interface for communicating between electronic components having multiple connection points includes a circuit for a state machine and a plurality of pins connected to the circuit. The implementation of the state machine is preferably configured to perform as a target and an initiator of a communication. The plurality of pins preferably corresponds to a set of target signals for handling communication involving the component as a target and a set of initiator signals handling communication involving the component as an initiator.

In one preferred embodiment, the pins are each unidirectional and include at least one input pin and at least one output pin. Preferably, the number of input pins is preferably equal to the number of output pins and the set of target signals is symmetric with the set of initiator signals.

In another aspect, an electronic component includes the above-described androgynous interface. In yet another aspect, an electronic component that includes the above-described androgynous interface is modeled with the assistance of a computer.

In another aspect of the present invention, an integrated circuit includes a bus, a plurality of functional blocks and a plurality of ports, where each port connects the bus to one of the plurality of functional blocks. Each of the plurality of ports preferably is designed to perform as both a target and an initiator of a communication.

In yet another aspect, a computer-assisted model of an integrated circuit includes a bus model, a number of functional block models, and a corresponding number of port models, where each port model connects the bus model to one of the functional block models. Each of the plurality of port models preferably is designed to perform as both a target and an initiator of a communication.

In yet another aspect, a method of designing an integrated circuit includes several steps. In one step, a foundation block for the integrated circuit is specified, including specifying the locations of multiple androgynous interfaces in the integrated circuit. In another step, one or more component blocks comprising the integrated circuit are identified. In another step, the component blocks to form a layout of the integrated circuit are positioned in a manner that minimizes connection distances between functional blocks and between functional blocks and the androgynous interfaces of the foundation block. In another step, the androgynous interfaces are set to perform as targets or initiators based on the layout.

Further embodiments, variations and enhancements are also disclosed herein.

BRIEF DESCRIPTION OF THE DRAWINGS

FIG. 3 is a diagram of a general process flow for a block-based integrated circuit design.

FIG. 5 is a table depicting an example of a set of signal designations implementing a symmetric androgynous communication interface.

FIG. 7 is a table depicting a mapping of signal designations to translate between a blocks using an androgynous virtual component interface protocol and a bus employing a System-on-Chip (SOC) protocol.

DETAILED DESCRIPTION OF THE PREFERRED EMBODIMENTS

Preferred embodiments will now be described, with reference as necessary to the accompanying drawings. First, however, additional information is provided concerning electronic design methodology and the use of automation (EDA) in such a methodology.

Chip designers generally use a top-down design methodology, starting with hardware description languages (HDLs), such as Verilog® or VHDL, for example, to create an integrated circuit by hierarchically defining functional components of the circuit, and then decomposing each component into smaller and smaller components. The components used in integrated circuits can be characterized as either functional or communication components or blocks.

From the HDL or other high level description, the actual logic cell implementation is typically determined by logic synthesis, which converts the functional description of the block into a specific circuit implementation of the block. The circuit implementation typically exists as a netlist, comprising logic cells or component blocks and including one or more communication blocks. The component blocks are then placed and routed, resulting in a physical layout file. The physical layout file is generally used as a design "blueprint" for fabrication of the integrated circuit. At each stage of the design process, as well as at the fabrication stage, various tests may be run to ensure correct operability of the circuit design.

Figure 1:
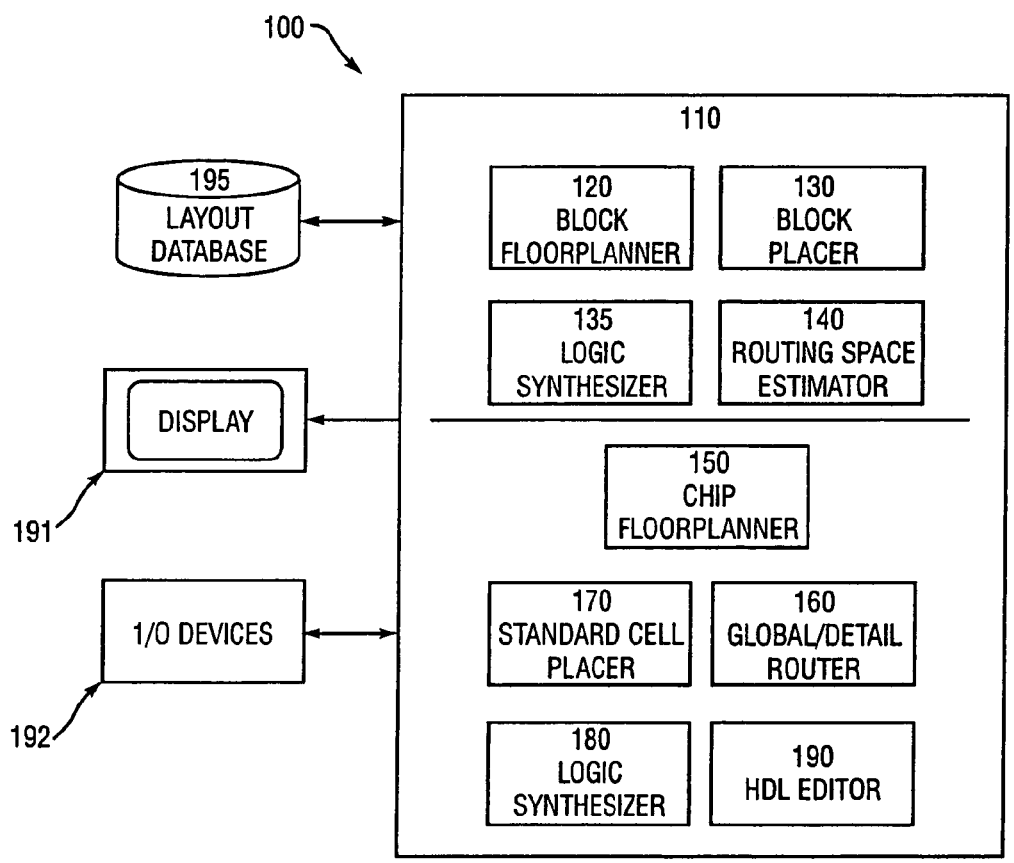
FIG. 1 is a diagram of a computer system that may be used in connection with various embodiments of the invention as described herein.

FIG. 1 is a diagram of a computer system that may be used in connection with various embodiments of the invention as described herein. As shown in FIG. 1, a computer system 100 includes a computer 110 connected to a display 191 and various input-output devices 192. The computer 110 may comprise one or more processors (not shown), as well as working memory (e.g., RAM) in an amount sufficient to satisfy the speed and processing requirements of the system. The computer 110 may comprise, for example, a SPARC™ workstation commercially available from Sun Computers, Inc. of Santa Clara, Calif., or any other suitable computer.

The computer 110 contains stored program code including, in one embodiment, a block floorplanner 120, a block placer 130, a logic synthesizer 135 and a routing space estimator 140. The block floorplanner 120 provides for the definition of block functions, block regions, and constraints on these for the purpose of interactive floorplanning operations by the circuit designer, and the control of placement operations of the block placer 130. The block placer 130 determines the placement of cells within blocks according to the constraints defined by the circuit designer. The routing space estimator 140 estimates routing space required for routing the blocks, given the placement of such blocks by the block placer 130.

In support of the above-mentioned system components, a chip floorplanner 150, global/detail router 160, standard cell placer 170, logic synthesizer 180, and HDL editor 190 may be usefully employed. Operation of the chip floorplanner 150, global/detail router 160, standard cell placer 170, logic synthesizer 180, and HDL editor 190 is conventional, as the design of these components is well known in the art of electronic design automation. Commercially available examples of these system components are Preview™, Cell3™, QPlace™, Synergy™, and Verilog®, respectively.

The computer 110 is preferably coupled to a mass storage device (e.g., magnetic disk or cartridge storage) providing a layout database 195 with which the foregoing system components interface. The layout database 195 may be implemented using the EDIF database standard. The computer 110 may also comprise or be connected to mass storage containing one or more component libraries (not shown) specifying features of electrical components available for use in circuit designs.

Figure 2A:
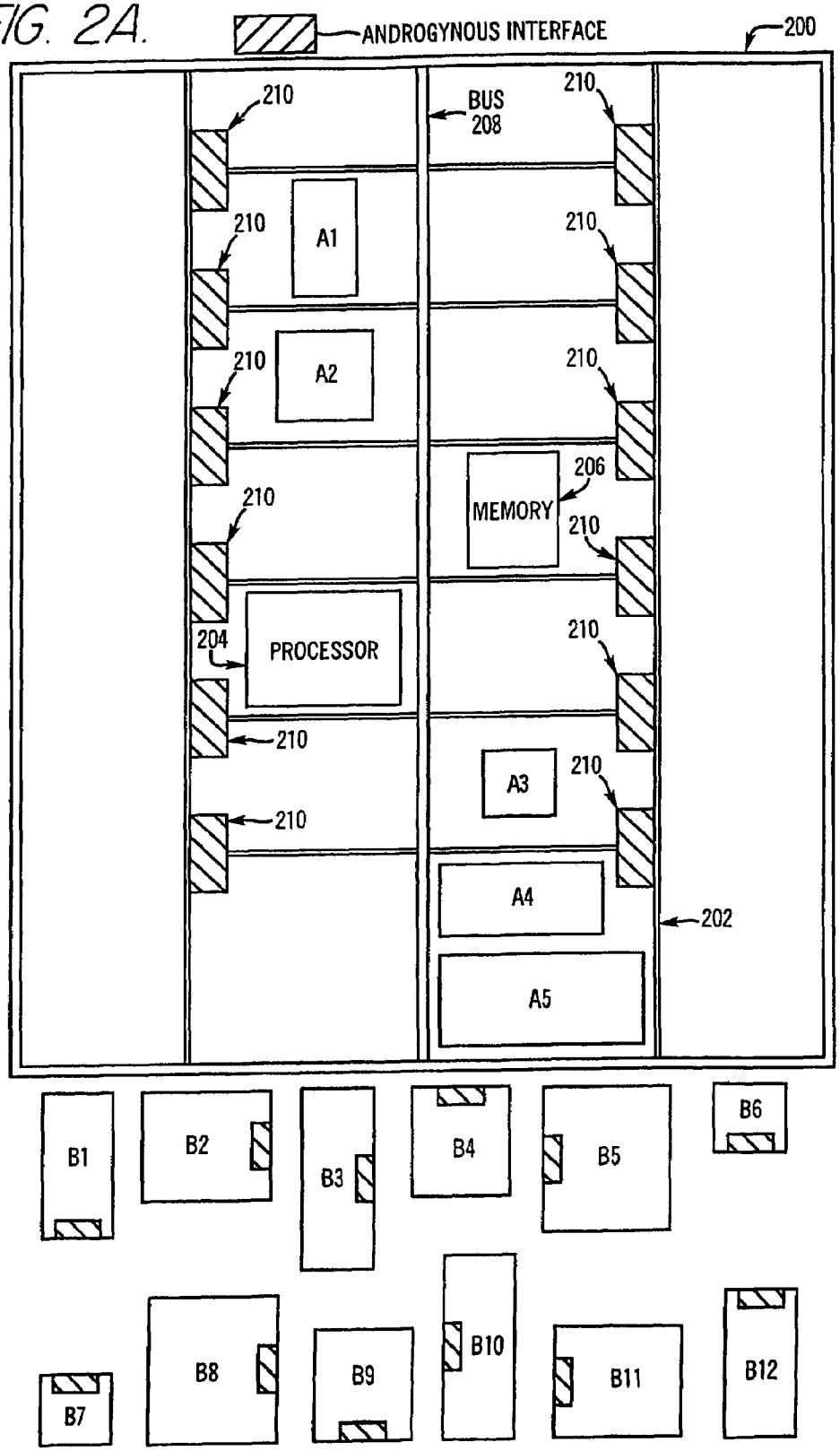
FIG. 2A is a diagram of a simplified integrated circuit as may be generated using a computer system such as shown in FIG. 1, before the component blocks have been placed on the integrated circuit chip.

Referring now to FIG. 2A, there is shown a block illustration of a simplified IC 200 before the design of the IC has been completed, wherein a foundation block 202 and a number of peripheral component blocks B1, . . . , B12 have been specified, but where the actual connections between blocks remain undetermined. In actual, more realistic integrated circuit designs, the integrated circuit 200 would be far more complicated. However, FIG. 2A is useful for purposes of illustration. The foundation block preferably includes a processor 204, a memory 206, several other component blocks, A1, . . . A5, and a communication block comprising a bus 208 and twelve androgynous ports 210. The ports 210 are androgynous because they may be configured as targets or initiators in the communications interface after the layout of the IC 200 has been finalized. Finalizing the layout preferably requires placing the other IC components B1, . . . , B12 on the chip. The foundation block 202, including its components (the processor 204, the memory 206, and components, A1 through A5), and the other peripheral component blocks are preferably fully characterized in the layout database 195.

Figure 2B:
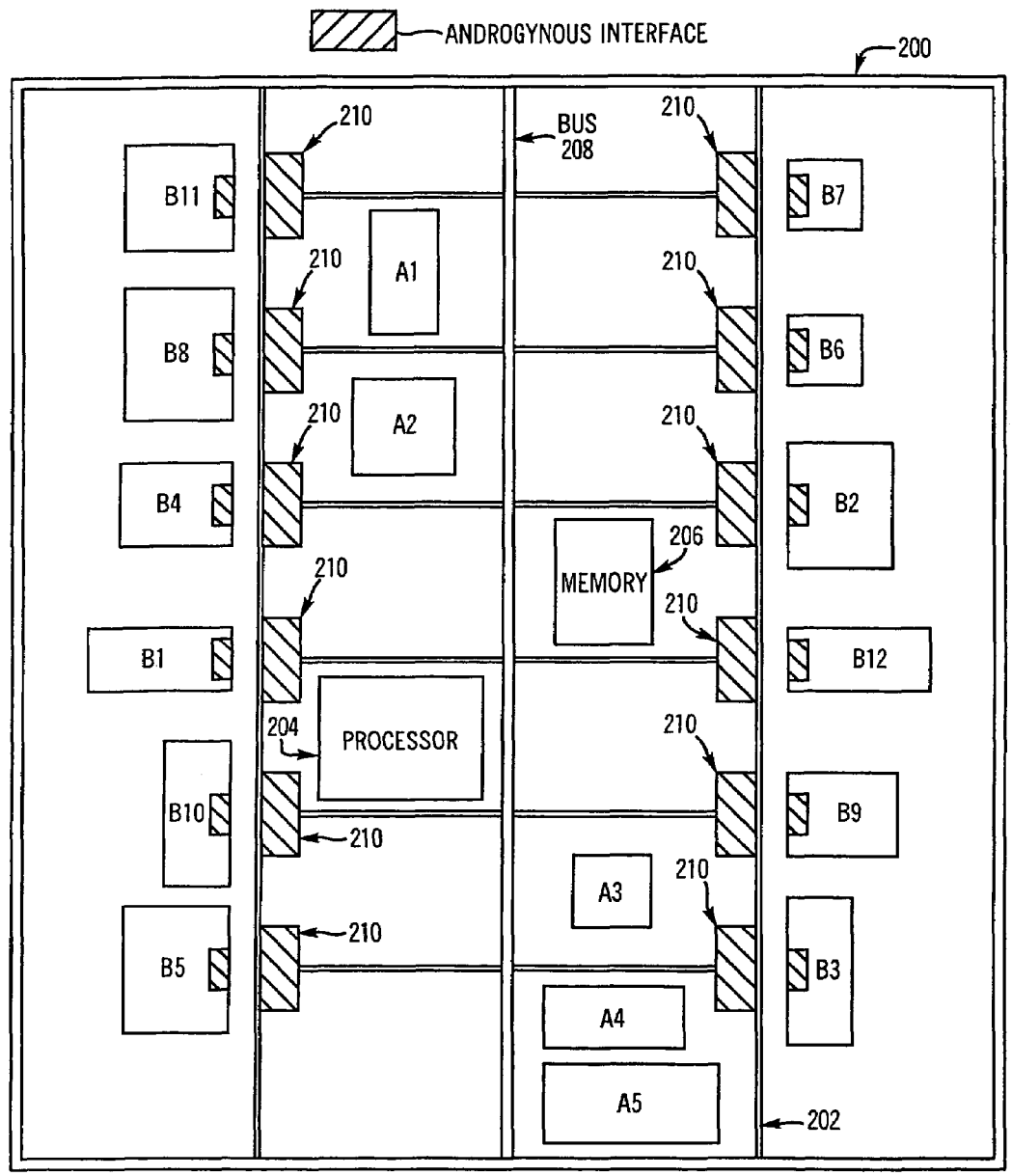
FIG. 2B is a diagram of a simplified integrated circuit as may be generated using a computer system such as shown in FIG. 1, after the component blocks have been placed on the integrated circuit chip.

FIG. 2B is a diagram depicting the results of placing the component blocks, B1 through B12 on the chip. Preferably, the blocks have been placed in a manner that is optimal with respect to location and the lengths of the connections to the ports on the foundation block. The placement, however, does not account for an interface type for a particular port on the edge of the foundation block because each port is androgynous and the same as every other port on the block. That is, no port is "hardened" to perform as a target or an initiator. Thus, the placement of the blocks, B1 though B2 is preferably optimized towards other considerations.

FIG. 3 is a diagram of a general process flow 300 for a block-based circuit design, illustrating some of the various levels of integrated circuit design abstraction as described above. As illustrated in FIG. 3, a register transfer logic (RTL) file 301 in the form of an HDL file or other high level functional description undergoes a specification (floor planning and part assignment) process 302. In this process 302, component blocks are identified from a component library 306 to perform specific functions set out in the RTL file 301. The component blocks are preferably predefined, and although one or more may be based on a customized design not stored or only recently stored within the library 306.

In the next step 303, a form of logic synthesis is performed, where in one preferred embodiment, the functional description of the connections between the components is converted into a specific connection implementation which may be stored in the form of a netlist file 304. As part of this compile process 303, the component library 306 is generally referenced, which stores information concerning the androgynous interface, and the characteristics of the components which are needed in order to determine their functional connectivity. The netlist file 304, as previously noted, generally identifies the component blocks from the library 306, and describes the specific component-to-component connectivity.

By application of a physical design process 309 shown in FIG. 3, the component blocks of the netlist file 304 are then placed and routed, resulting in a layout file 310. The component library 306 is utilized in this process stage in order to obtain information concerning the sizes of the components that may be present in the netlist file 304. Previously, this information includes interface specifications, such as the whether the numbers and locations of the interfaces, whether each interface is a target or initiator, the number of pins and their signal assignments. As described in the background section above, the placement and routing operation is then performed and may be automated in a manner to optimize the ICs ultimate performance by minimizing connection lengths and the IC's overall footprint. This placement and routing process however, adheres to the interface specifications obtained from the component library 306.

From the layout file 310, a verification process 312 may be run, as further illustrated in FIG. 3, resulting in a mask file 315 in, for example, a GDSII or CIF format. The mask file 315 may be provided to a foundry, and contains enough information to allow the foundry to manufacture an actual integrated circuit therefrom.

In one aspect, systems and methods are provided in connection with certain embodiments disclosed herein for designing integrated circuits and for creating and using an androgynous interface between electronic components of an integrated circuit.

Figure 4:
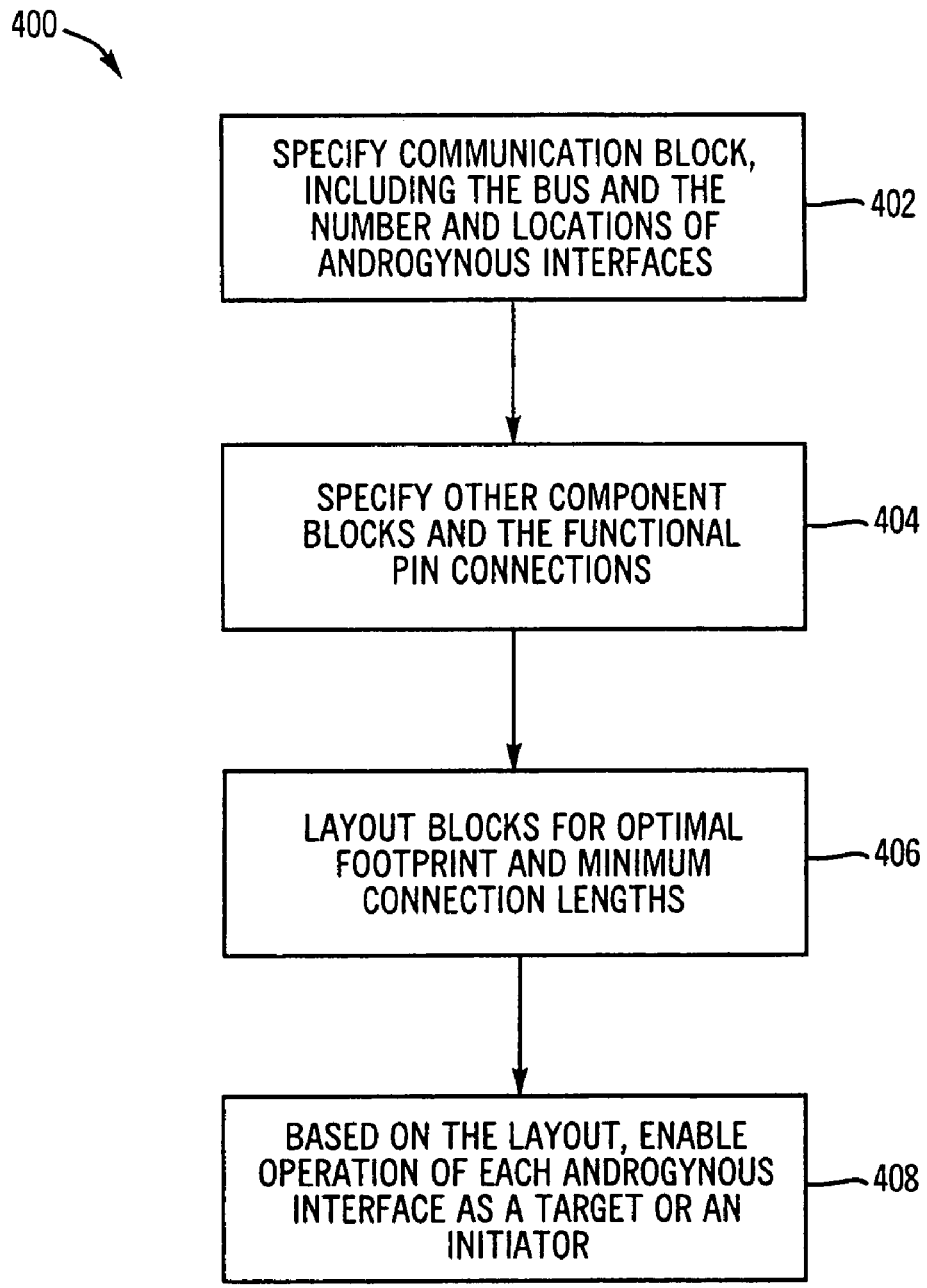
FIG. 4 is a flow diagram detailing a preferred method of designing an integrated circuit.

FIG. 4 details a preferred method 400 for designing an IC such that the layout is optimized without having to adhere to specifications regarding whether a port is a target or an initiator. In a particular embodiment, the ports that are unspecified, as to being targets or initiators, are on the IC's foundation block, which includes a processor, memory, and a communication block that specifies a bus and a plurality of ports that will in operation perform as either targets or initiators. In a first step 402, the communication block (or the complete foundation block) is specified. This communication block may be extracted from the component library as part of a logic synthesis operation or may be originally designed. The communication block preferably is specified with a particular bus configuration and footprint on the IC chip. The communication block is further described by a fixed number of ports and particular locations around the block. Each port is defined to be androgynous such that at this stage of design, it can be later adapted or bound to perform as a target or an initiator.

In a next step 404, other component blocks are specified. Like the communication block, these other component blocks are preferably identified as part of a process or program to synthesize logic and produce a netlist file. Because steps 402 and 404 relate to the specification of different components, in an alternative embodiment, the steps 402, 404 may be switched in order or performed at the same time.

In a next step 406, the blocks are laid out on the IC. In this step 406, which may be performed automatically, the layout of the blocks on the IC is optimized to keep connection lengths between input and output pins on different block to a minimum. Furthermore, the blocks are preferably organized such that the overall area of the IC is also minimized.

In a next step 408, each of the androgynous interfaces on the communication block are adapted to perform as a target or an initiator based on the required type of interface for the block connected to the interface by the layout provided by step 406. In an alternative embodiment, the androgynous interface is designed such that ports on the IC perform, in an operational environment, as targets and initiators of communications.

A number of methods exist to adapt the androgynous interfaces to perform as either targets or initiators. In one preferred embodiment, the interface logic includes configuration registers to enable the setting of one side of the interface as a target or an initiator. When configured as a target, the sets of pins are configured to receive or transmit signals according to the protocol for the target. When configured as an initiator, preferably the same set of pins is used to transmit and receive signals according to the protocol for an initiator.

In another embodiment, an interface type parameter is input to a logic synthesis operation that synthesizes away the state machine configuration that is not used for actual operation of the IC. Preferably, what remains is the state machine for the interface that is selected using the logic synthesis parameter. Alternatively, the parameter is used to generate the logic for the selected interface type. The androgynous interface, however, is configured such that the same pin connectivity is maintained regardless of which interface type is selected.

In another embodiment, a pin on the androgynous interface is tied to a logical 1 or 0 based on whether the interface is to operate as a target or initiator. The logic to control the interface is therefore preferably configured to operate as a target or initiator depending on the value of the input received using the additional pin.

The androgynous interface preferably exhibits certain general characteristics. On a basic level, the androgynous interface includes logic and I/O structure to perform both as a target or an initiator. That is, the interface includes a set of pins, where each pin has a signal designation, a signal direction, and a specification for a corresponding pin to which it connects. Thus, the set of pins includes a sufficient number of pins to include all of the signals that are received or transmitted by a target and all of the signals that are received or transmitted by an initiator. In one embodiment, each pin in the set of pins is dedicated to perform a target function or an initiator function. In an alternative embodiment, some or all of the pins have target or initiator signal specifications that depend on a setting of the interface to perform as one or the other. Optionally, this setting is dynamic, such that the interface switches roles from one communication to the next. As another option, the setting is part of an initialization of the device on start-up. Alternatively, the setting is hardwired or is otherwise fixed in the interface logic. Advantageously, in the configuration in which the pins are configurable with respect to interface type, fewer pins are employed to implement the interface.

As a specific preferred characteristic, the androgynous interface includes the same number of input lines as output lines. That is, the set of pins includes equal numbers of input pins as output pins. Applying this criterion, when an androgynous interface is set for use as a target or initiator, fewer, if any, pins need go unused or be tied off.

As a more specific preferred feature, the androgynous interface is a symmetric interface. With this feature, the interface includes the same number of input pins as output pins. Furthermore, each pin includes a signal designation in a role as a target pin and a signal designation in a role as an initiator pin. In addition, the corresponding pin to which a given pin connects preferably has the same dual functionality, but in particular instances always employs the signal designation that is complementary to that of the given pin.

In each of the above embodiments, the logic used to implement the androgynous interface may be fully hardware implemented, may include software-coded elements or may be fully implemented in software using a general or special purpose processor.

In a preferred embodiment of the symmetric androgynous interface, the interface is an extension of the unidirectional interface described in the VSIA VCI Standard. In one embodiment, the androgynous interface is the virtual component (VC) interface that includes hardware that performs the logic set out in the VSIA. In another embodiment, the androgynous interface comprises generalized computing hardware that is loaded with the protocol to execute as a VC interface.

Therefore, the androgynous interface includes a set of signals that follow the VC interface protocol, but can be used either as an initiator, a target or both. This permits the number of VC interfaces to be defined later during the foundation block integration, and then even later define the size and type of each interface.

FIG. 5 depicts a preferred embodiment of a signal map for a symmetric androgynous interface adapted from the Basic VC interface (BVCI) disclosed in the VSIA VCI Standard. To adapt the BVCI to be a symmetric androgynous interface, the names of the signals are reversed, to consider "R_" as received instead of response.

In the BVCI, the Error signal does not exist, but is specified for the androgynous VC interface. Furthermore, the Wrap, Const, Contig signals in BVCI are assumed to be part of the Cmd signal in the androgynous VC interface depicted in FIG. 5. Additional return signals are defined for androgynous interface, such as Cmd, Clen, Cfix, which do not have return signals in the BVCI. However, the specification of these signals enables both sides of the androgynous VC interface to look the same, and therefore creates an androgynous interface that is symmetric. The target and initiator sides of the interface have the same number of pins, the same connections, and pin designations.

In a preferred embodiment, the interface that first issues a data valid signal preferably becomes the initiator. The other side then automatically becomes the target and acknowledges the data valid signal. The target then may issue a data valid signal in response to each acknowledged data valid signal it receives. The initiator then issues an ACK signal. The end of the packet on the data valid side preferably is sent with an EOP signal, and the end of the response packet is preferably sent with an EOP signal. The response EOP signal preferably indicates that the interface is waiting to determine who next is the initiator.

A key advantage offered by this symmetry is that the state machine logic is essentially the same regardless whether the interface acts as a target or initiator. Little additional logic is needed to enable the interface to operatively perform as a target or initiator.

Figure 6:
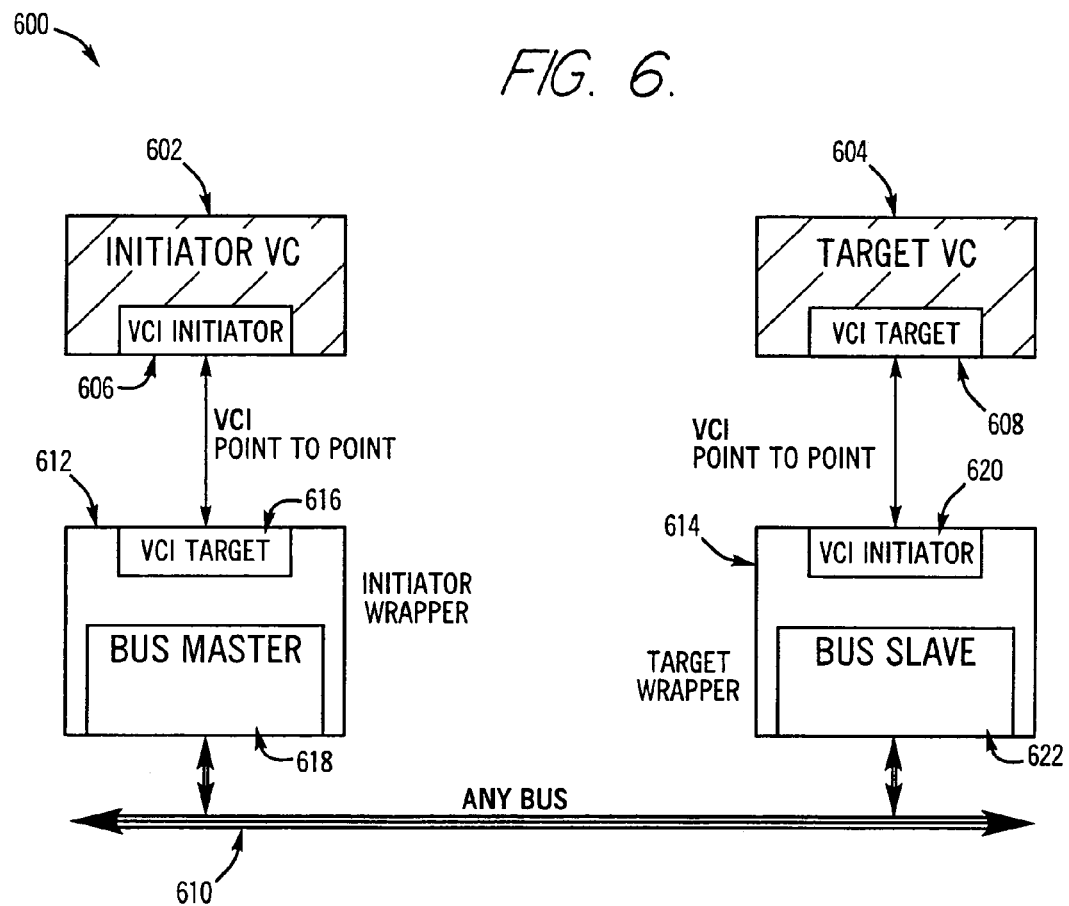
FIG. 6 is a diagram depicting communications system between two components that employs an androgynous interface between the components and a generic communication bus.

In another alternative embodiment of a symmetric androgynous interface, the interface is integrated into bus wrappers, including a target wrapper and an initiator wrapper. The bus wrapper defines a package that translates the protocol for a particular bus type into an androgynous VCI protocol. Thus, functional components that adhere to the androgynous protocol can communicate using any bus that includes an androgynous VCI bus wrapper. FIG. 6 depicts a configuration 600 for communicating between two components 602, 604 that employ a VC interface. A component block 602 performs as an initiator and includes an initiator interface 606. Another component block 604 correspondingly performs as a target and includes a target interface 608. The two components 602, 604 communicate via a bus 610, that may be of any convenient type, by virtue of an initiator wrapper 612 and a target wrapper 614 that translate the signals in the VCI protocol to the bus protocol and vice versa. The initiator wrapper 612 preferably includes a VCI target interface 616, a bus master interface 618, and interface-to-interface translation logic. Correspondingly, the target wrapper 614 includes a VC initiator interface 620, a bus slave interface 622, and interface-to-interface translation logic.

In one preferred embodiment, the mapping performed by the target and initiator wrappers 614, 612 implements a translation of the System-on-Chip (SOC) standard to an androgynous symmetric adaptation of the VC interface, and vice versa. In this embodiment, in relation to FIG. 6, the bus 610 complies with the SOC standard. FIG. 7 is a table depicting an example of the signal mapping for these two interfaces.

The androgynous VC interface is similar to the SOC standard in that first, both preferably use a four-wire protocol. In the androgynous interface, a req->gnt signal is used for writes from initiator to target and a r_req->r_gnt signal is used for the return reads from the target to the initiator. Second, the interface standards have the same EOP and Cmd (command) structure. Third, the interface standards preferably have the same data and address structure.

With respect to the differences, preferably no byte enables, non-sequential addressing, or chaining modes are used. Also, an r_cmd signal, an r_error signal and an r_d_size signal are added to make the VC interface symmetric. Further, the androgynous interface preferably uses an additional parameter MASTER that may be set. If MASTER is set, then the interface to the functional block is a master. The wrapper for the interface then employs the mapping on the left side of FIG. 7. If MASTER is not set, then the interface for the functional block is a slave, and the wrapper for the interface employs the mapping on the right side of FIG. 7.

Optionally, to dynamically change between initiator and target protocols on one interface, two signals may be passed between the VCI wrappers:

| I/T | | T/I |
|---|---|---|
| R_IT | <- | IT |
| IT | -> | R_IT |

The IT signal is preferably set by the side that is the initiator, and the target preferably responds by clearing its IT signal. Subsequent requests are then considered errors if the responding IT signal is set or the wrapper's IT signal is cleared. This additional handshake protocol is optionally used in other embodiments.

Figure 8:
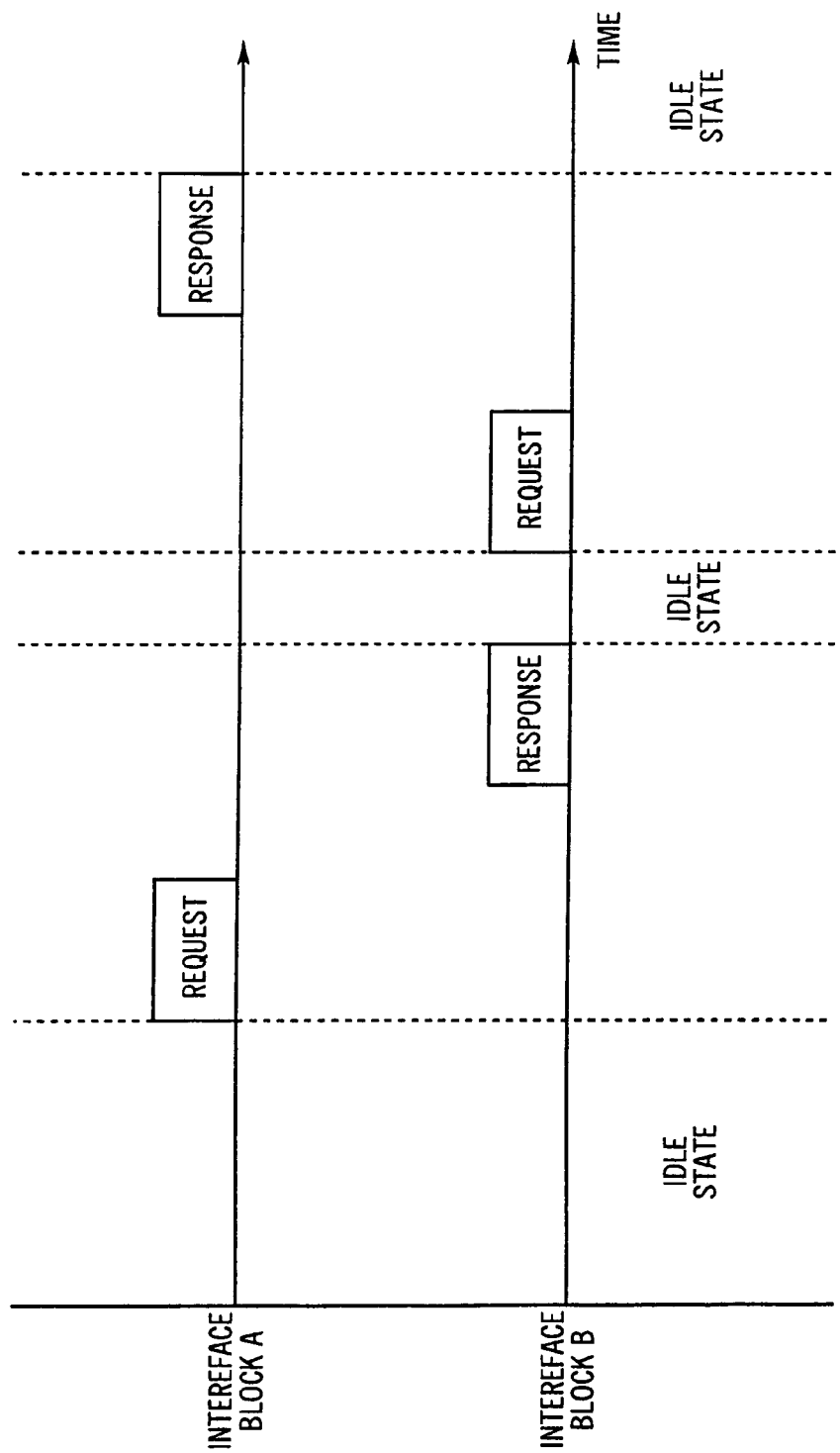
FIG. 8 is a timing diagram depicting the operation of a system employing an androgynous communication interface that allows one side of the interface operating as an initiator to transition to a target interface type, and vice versa.

FIG. 8 depicts an example of transactions between two blocks A and B. FIG. 8 depicts a window in time when the androgynous interfaces are in an idle state, preferably enabling the interfaces to switch interface types, from initiator to target and vice versa. Initially, Block A is the initiator and transmits a request to Block B. Block B then responds to the request to complete the transaction. Before the issuance of the request and after the response is received, the interfaces for the blocks are in an idle state. It is during this time that the interfaces may switch interface types. After the response by Block B, the types are switched, as evidenced by the issuance of a request by Block B, demonstrating that it is now an initiator. Only after Block A completes the transaction by issuing a response to Block B's request do the interfaces return to an idle state, enabling an interface type switch by the two interfaces.

As discussed above, the androgynous interface alternatively is designed to allow both interface types to be available in one physical interface for any given communication operation. A single physical interface potentially avoids issues that arise due to the fact that two interfaces take up actual loading on the bus and typically require additional pins. Two separate interfaces, however, are optionally employed if both target and initiator operations are needed at the same time.

In other embodiments, the androgynous interface may be implemented as a bi-directional interface, where signals for a given pin are both input and output signals. The androgynous interface may be adapted to other implementation of the VSIA VCI Standard including the Peripheral and Advanced VC interfaces.

In another embodiment, the use of an androgynous interface may be employed with pin unscrambling systems and methods as described in our application Ser. No. 09/766,311 entitled "Adaptable Circuit Blocks for Use in Multi-Block Chip Design," and filed Jan. 18, 2001.

The above-described embodiments describe the implementation and use of androgynous interfaces in the context of component blocks that communicate with or between integrated circuits. However, the generalized embodiments of the androgynous interface are preferably used in other contexts that involve communication blocks that transfer information from one point to another. In the IC context, the communication block includes a bus (either bi-directional or unidirectional and employing multiplexers) and multiple androgynous ports off of the bus. In other contexts, the communication block may be a cross-bar-switch, a hub, a router, a network, or a memory such as a FIFO that is employed to transfer data. In these other contexts, the communication block includes a set of appropriate androgynous interfaces. Thus, the androgynous interfaces disclosed herein may be generally applied to other areas of electronic communication.

While preferred embodiments of the invention have been described herein, and are further explained in the accompanying materials, many variations are possible which remain within the concept and scope of the invention. Such variations would become clear to one of ordinary skill in the art after inspection of the specification and the drawings. The invention therefore is not to be restricted except within the spirit and scope of any appended claims.

What is claimed is:

1. A method of designing an integrated circuit comprising the steps of:
   (a) specifying a communication block for the integrated circuit, including the locations of a plurality of unspecified androgynous interfaces;
   (b) identifying functional blocks to comprise the integrated circuit;
   (c) positioning functional blocks to form a layout of the integrated circuit so that distances of connections between functional blocks and distances of connections between functional blocks and unspecified androgynous interfaces are minimized; and
   (d) adapting each unspecified androgynous interface to perform as a target or as an initiator based on the layout, the step of adapting being performed after the functional blocks are positioned to form the layout of the integrated circuit.

2. The method of claim 1, the step of adapting each unspecified androgynous interface being performed dynamically.

3. The method of claim 1, further comprising the step of switching an androgynous interface between performing as the target and performing as the initiator.

4. The method of claim 1, wherein an androgynous interface is adapted to perform as the target of a first communication, further comprising the step of
   switching the interface from the target of the first communication to the initiator of a subsequent communication.

5. The method of claim 1, wherein an androgynous interface is adapted to perform as the initiator of a first communication, further comprising the step of
   switching the interface from the initiator of the first communication to the target of a subsequent communication.

6. The method of claim 1, further comprising the step of switching each androgynous interface between performing as the target and performing as the initiator.

7. The method of claim 6, wherein each androgynous interface is adapted to perform as the target of a first communication and switches to perform as the initiator of a subsequent communication.

8. The method of claim 6, wherein each androgynous port is adapted to perform as the initiator of a first communication and switches to perform as the target of a subsequent communication.

9. The method of claim 1, wherein each unspecified androgynous interface is adapted to perform as the target or the initiator based on a type of interface that is required.

10. The method of claim 1, wherein each unspecified androgynous interface is adapted to perform as the target and the initiator at different times.

11. The method of claim 1, further comprising the step of finalizing the layout of the integrated circuit.

12. The method of claim 11, wherein each unspecified androgynous interface is adapted to perform as the target or the initiator after the layout of the integrated circuit is finalized.

13. The method of claim 1, the step of adapting each unspecified androgynous interface further comprising the step of
   setting a register of an androgynous interface so that the interface performs as the target or the initiator.

14. The method of claim 1, the step of adapting each unspecified androgynous interface further comprising the step of
   performing a logic synthesis that deletes a state machine configuration that is not used for actual operation of the integrated circuit so that a remaining state machine adapts the interface to perform as the target or the initiator.

15. The method of claim 1, the step of adapting each unspecified androgynous interface further comprising adapting each unspecified androgynous interface according to a logic value of a pin of the interface being set to a "1" or a "0".

16. The method of claim 1, wherein the step of positioning functional blocks to form the layout minimizes a footprint of the integrated circuit.

17. The method of claim 1, wherein the step of positioning functional blocks does not account for a type of interface.

18. The method of claim 1, the specified communication block being part of a foundation block that includes a processor.

19. The method of claim 1, wherein each unspecified androgynous interface is adapted to perform as the target or as the initiator without adhering to a specification of a component library.

20. The method of claim 1, wherein each unspecified androgynous port interface is bi-directional.

* * * * *